(12) United States Patent
Xie

(10) Patent No.: US 7,732,237 B2
(45) Date of Patent: Jun. 8, 2010

(54) QUANTUM DOT BASED OPTOELECTRONIC DEVICE AND METHOD OF MAKING SAME

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 443 days.

(21) Appl. No.: 11/169,196

(22) Filed: Jun. 27, 2005

(65) Prior Publication Data

US 2006/0289855 A1 Dec. 28, 2006

(51) Int. Cl.
*H01L 21/18* (2006.01)
(52) U.S. Cl. ............... 438/47; 257/E33.014; 977/784; 977/951
(58) Field of Classification Search ............ 438/42, 438/43, 44, 46, 47, 37, 63, 84, 87, 93, 94, 438/95, 102, 763, 933, 962; 257/E33.069, 257/E31.005, E31.051, E33.014, E33.016; 977/778, 779, 784, 949, 950, 951, 953, 954; 372/43.01, 44.01, 45.01, 45.011, 45.012
See application file for complete search history.

(56) References Cited

U.S. PATENT DOCUMENTS

| | | | | |
|---|---|---|---|---|
| 5,310,451 A | * | 5/1994 | Tejwani et al. | 438/459 |
| 5,351,163 A | * | 9/1994 | Dawson et al. | 361/321.1 |
| 5,395,481 A | * | 3/1995 | McCarthy | 438/479 |
| 5,413,679 A | * | 5/1995 | Godbey | 438/702 |
| 5,557,627 A | * | 9/1996 | Schneider et al. | 372/50.12 |
| 5,888,885 A | | 3/1999 | Xie | |
| 6,046,065 A | * | 4/2000 | Goldstein et al. | 438/46 |
| 6,521,041 B2 | * | 2/2003 | Wu et al. | 117/94 |
| 6,596,555 B2 | * | 7/2003 | Bensahel et al. | 438/22 |
| 6,697,413 B2 | * | 2/2004 | Hwang et al. | 372/96 |
| 2004/0042518 A1 | * | 3/2004 | Tatum et al. | 372/46 |
| 2008/0006817 A1 | * | 1/2008 | Kawaguchi | 257/14 |

OTHER PUBLICATIONS

PCT International Search Report for PCT/US2005/022661, Applicant: The Regents of the University of California, Form PCT/ISA/220 and PCT/ISA/210, dated Jan. 18, 2008 (4 pages).
PCT Written Opinion for PCT/US2005/022661, Applicant: The Regents of the University of California, Form PCT/ISA/237, dated Jan. 18, 2008 (8 pages).
PCT International Preliminary Report on Patentability (Chapter I of the Patent Cooperation Treaty) for PCT/US2005/022661, Applicant: The Regents of the University of California., Form PCT/IB/326 and 373, dated Apr. 2, 2009 (9 pages).

* cited by examiner

*Primary Examiner*—Lynne A Gurley
*Assistant Examiner*—Andrew O Arena
(74) *Attorney, Agent, or Firm*—Vista IP Group LLP

(57) ABSTRACT

A method of forming an optically active region on a silicon substrate includes the steps of epitaxially growing a silicon buffer layer on the silicon substrate and epitaxially growing a SiGe cladding layer having a plurality of arrays of quantum dots disposed therein, the quantum dots being formed from a compound semiconductor material having a lattice mismatch with the silicon buffer layer. The optically active region may be incorporated into devices such as light emitting diodes, laser diodes, and photodetectors.

11 Claims, 2 Drawing Sheets

QUANTUM DOT BASED OPTOELECTRONIC DEVICE AND METHOD OF MAKING SAME

FIELD OF THE INVENTION

The field of the invention generally relates to optoelectronic devices and methods of making the same. In particular, the field of the invention relates to optoelectronic devices such as, for example, laser diodes, light emitting diodes, and photodetectors formed using quantum dots.

BACKGROUND OF THE INVENTION

Optoelectronic devices are becoming increasingly important to a number of industries such as, for example, the telecommunication industry. Exemplary optoelectronic-based devices include laser diods (LD), light emitting diodes (LEDs), and photodetectors (PDs). These devices are fabricated with an optically active region made of semiconducting materials that have different lattice constants than the substrate on which they are located. Silicon (Si) is a well known substrate material used in integrated circuit technologies and has developed a mature technological base with respect to its use in fabricating integrated circuits. Unfortunately, silicon is unable to emit light and therefore cannot be used in the "active" portion of optoelectronic devices for the emission or detection of optical radiation.

There have been unsuccessful efforts in the past to integrate compound semiconductor materials that are optically active (e.g., they emit optical radiation) with silicon. The primary obstacle in integrating compound semiconductor materials in silicon are the crystalline defects produced caused by the growth of the compound semiconductor materials on the silicon substrate. The defects are the result of the relatively large lattice mismatch (i.e., different lattice constants) between the adjacent compound semiconductor materials and the underlying silicon substrate. For instance, there is an approximately 11% lattice mismatch between InAs and Si, and a 4% lattice mismatch between GaAs and Si. InGaAs is an alloy of two compound semiconducting material (InAs and GaAs) that emits light at a wavelength ranging from 0.8 µm to above 1.5 µm—the wavelength for most of the optical fiber network that serves current telecommunication needs (e.g., the internet and other WANs).

InGaAs, when epitaxially grown on Si <001> substrates, is known to have a critical layer thickness on the order of 10 angstroms. Thus, the thickness of InGaAs which can be grown epitaxially on a Si substrate is below 10 angstroms. In comparison, the thickness of a typical quantum well laser formed from InGaAs is on the order of 2000 angstroms. Consequently, dislocation in InGaAs has been unavoidable. Dislocation introduced by epitaxial film relaxation severely limits the performance and useful life of optoelectronic devices including, for example, semiconductor lasers.

There thus is a need for a device and method in which compound semiconductor materials are employed on silicon substrates. Preferably, the device can be created by epitaxially forming the optically active region of optoelectronic devices on a silicon substrate. Preferably, the device may be formed with a very small or limited amount of optically active material.

SUMMARY OF THE INVENTION

The present invention is directed to a method of forming an optoelectronic device having an optically active region on a silicon substrate. In one aspect of the invention, the optically active region is formed on a silicon substrate using an array of epitaxially grown quantum dots from a compound semiconductor material. For example, the compound semiconductor material may have lattice mismatch with the underlying Si substrate.

In another aspect of the invention, the quantity or amount of optically active material (e.g., InGaAs), when present in the form of quantum dots, is minimized while still providing good performance. For example, InGaAs quantum dots may be formed, e.g., optical gain, without dislocations. This is in contrast with film-based approaches in which much more material is needed to achieve the level of optical activity, as a result, the lattice mismatch between the compound semiconductor material and silicon causes a high density of dislocation in layers of sufficient thickness for optoelectronic applications.

In one aspect of the invention, a method of forming an optically active region on a silicon substrate includes the steps of epitaxially growing an optional silicon buffer layer on the silicon substrate and epitaxially growing a cladding layer having a plurality of arrays of quantum dots disposed therein, the quantum dots being formed from a compound semiconductor material having a lattice mismatch with the silicon buffer layer. The optically active region may be incorporated into devices such as light emitting diodes, laser diodes, and photodetectors.

In another aspect of the invention, a device having an optically active region includes a silicon substrate and a SiGe cladding layer epitaxially grown on the silicon substrate, the SiGe cladding layer comprising a plurality of arrays of InGaAs quantum dots separated by at least one SiGe spacing layer.

In another aspect of the invention, a method of forming an optically active region on a silicon substrate includes the steps of epitaxially growing an SiGe etch-stop layer on a silicon substrate and epitaxially growing a silicon buffer layer on the SiGe etch-stop layer. A cladding layer of SiGe is then epitaxially grown having an array of InGaAs quantum dots epitaxially grown therein. The back side of the silicon substrate is then etched followed by an etching of the SiGe etch-stop layer so as to expose the bottom surface of the silicon buffer layer. The optically active region described above may be interposed between two quarter wave stacks to form a vertical cavity surface emitting laser (VCSEL).

It is an object of the invention to provide a method of fabricating Si-based optoelectronic devices having optically active regions formed from compound semiconductor materials. Devices based on such hetero-structures (e.g., lattice mismatch) will have commercial longevity and good performance characteristics. Exemplary products which may be produced in accordance with the methods described herein include Si-based optical transceiver chips, laser diodes, light emitting diodes, and photodetectors.

Further features and advantages will become apparent upon review of the following drawings and description of the preferred embodiments.

DETAILED DESCRIPTION OF THE PREFERRED EMBODIMENTS

Figure 1A:
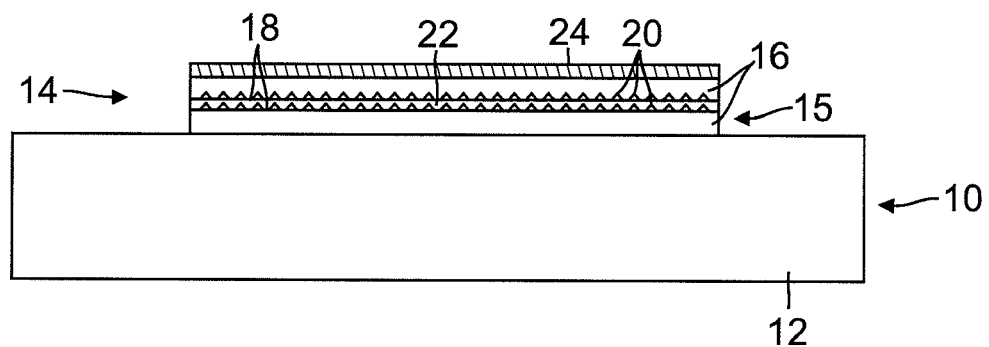
FIG. 1A illustrates a schematic representation of an edge emitting laser.

FIG. 1A illustrates a schematic representation of an edge emitting laser 10. The edge emitting laser 10 includes a p-type silicon substrate 12. An optically active region 14 is formed on the upper surface of the p-type silicon substrate 12. The optically active region 14 includes a silicon (Si) or silicon germanium (SiGe) cladding layer 16 having disposed therein one or more layers of an array 18 of quantum dots 20 formed from a compound semiconductor material. A quantum dot 20 is a cluster of atoms whose dimensions are less than the quantum mechanical wavelength of an electron or "hole." In one preferred aspect of the invention, the quantum dots 20 are formed from semiconductor materials with a direct energy band gap. Illustrative semiconductor materials for the quantum dots 20 include InGaAs, InGaP, InGaSb, PbTe, CdTe, and CdSe. In one aspect, the quantum dots 20 are formed from a compound semiconductor material having a lattice mismatch with the underlying silicon buffer layer (for example a lattice mismatch of at least 5%). As seen in FIG. 1A, the edges of the optically active region 14 may include etched facets 15.

In one aspect of the invention, the array 18 of individual quantum dots 20 is formed by growing islands or dots of semiconductor materials with a direct energy band gap on an array of preferential nucleation sites. These nucleation sites may be formed, for example, by introducing a series of perpendicularly-oriented dislocation lines (not shown) by epitaxially growing a strained film such as SiGe and allowing it to subsequently relax via dislocation. For example, U.S. Pat. No. 5,888,885 discloses a method of fabricating three-dimensional quantum dot arrays. The '885 patent is incorporated by reference as if set forth fully herein. A spacing layer 22 such as a layer formed from SiGe may be interposed between adjacent quantum dot arrays 18.

Still referring to FIG. 1A, in the case of an edge emitting laser 10, the cladding layer 16 includes an n-type silicon layer 24 disposed thereon. The n-type silicon layer 24 may also be heavily doped with n-type impurity to facilitate an Ohmic contact. The advantage of the optically active region 14 disclosed in FIG. 1A includes that fact that a very small amount of material (e.g., InGaAs) is sufficient for the desired optoelectronic functionality when the material is in the form of quantum dots 20. The small amount of the material under strain in the optically active region 14 reduces or mitigates the potential for crystalline defects. A second benefit of the optically active region 14 is that the dislocation network permits the formation of more organized and uniform quantum dots 20. For example, the nanometer-size patterning utilizing the strain field from a buried dislocation network produces more uniform size distribution of quantum dots 20. This is particularly beneficial in the case of LDs in which a single wavelength is selected by the resonant cavity. A tighter size distribution of quantum dots 20 results in more quantum dots 20 that participate in the lasing action—thereby reducing the amount of optically active compound semiconductors needed.

Figure 1B:
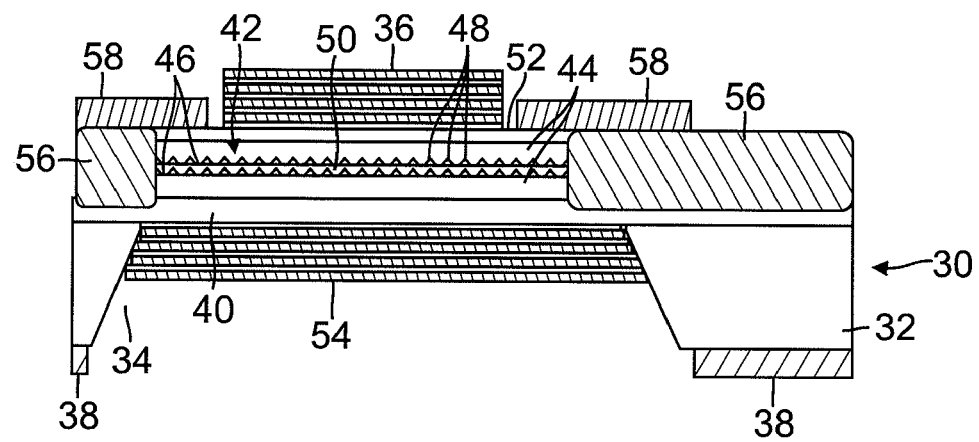
FIG. 1B illustrates a schematic representation of a surface emitting laser.

FIG. 1B illustrates an embodiment of a surface emitting laser 30. The surface emitting laser 30 may be, for example, a silicon-based vertical cavity surface emitting laser (VCSEL) such as that shown in FIG. 1B. The surface emitting laser 30 includes a p-type silicon substrate 32 having the bottom surface etched to form a cavity 34 that contains a quarter wave stack 54 (QWS). The quarter wave stack 54 is a dielectric coating formed by depositing alternating layers of high-low index materials, e.g., $SiO_2$ and $TiO_2$, in quarter-wave thicknesses. The quarter wave stack 54 is able to efficiently reflect optical radiation generated by the quantum dots (described below) during the lasing operation. The underside of the p-type silicon substrate 32 includes metal contacts 38.

Still referring to FIG. 1B, a doped, p-type silicon buffer layer 40 is formed on the silicon substrate 32 and interposed between the quarter wave stack 36. An optically active region 42 is formed on the upper surface of the p-type silicon buffer layer 40. The optically active region 42 includes a silicon or silicon germanium (SiGe) cladding layer 44 having disposed therein one or more array(s) 46 of quantum dots 48 formed from a compound semiconductor. In one aspect of the invention, the quantum dots 20 are formed from a compound semiconductor material having a lattice mismatch with the underlying silicon buffer layer. Alternatively, the quantum dots 20 may be formed by patterning such that lattice mismatch is not necessary. For example, the quantum dots 48 may be formed from InGaAs. A spacing layer 50 such as a layer formed from SiGe may be interposed between adjacent quantum dot arrays 46. A layer of doped n-type silicon is formed to create a top contact layer 52. A second quarter wave stack 54 is deposited on the layer 52 by, for example, sputtering or evaporation.

Oxide isolation regions 56 ($SiO_2$) are formed adjacent to the optically active region 42. The surface emitting laser 30 includes a top metal contact layer 58 formed, for example, by evaporating metal over a patterned resist and subsequent removal by a wet-solvent lift-off process. An optically transparent layer (not shown) may be disposed above the quarter wave stack 36.

The direction in which radiation is emitted from the surface emitting laser 30 may be controlled by adjusting the respective reflectivity of the quarter wave stacks 36, 54.

Figure 2:
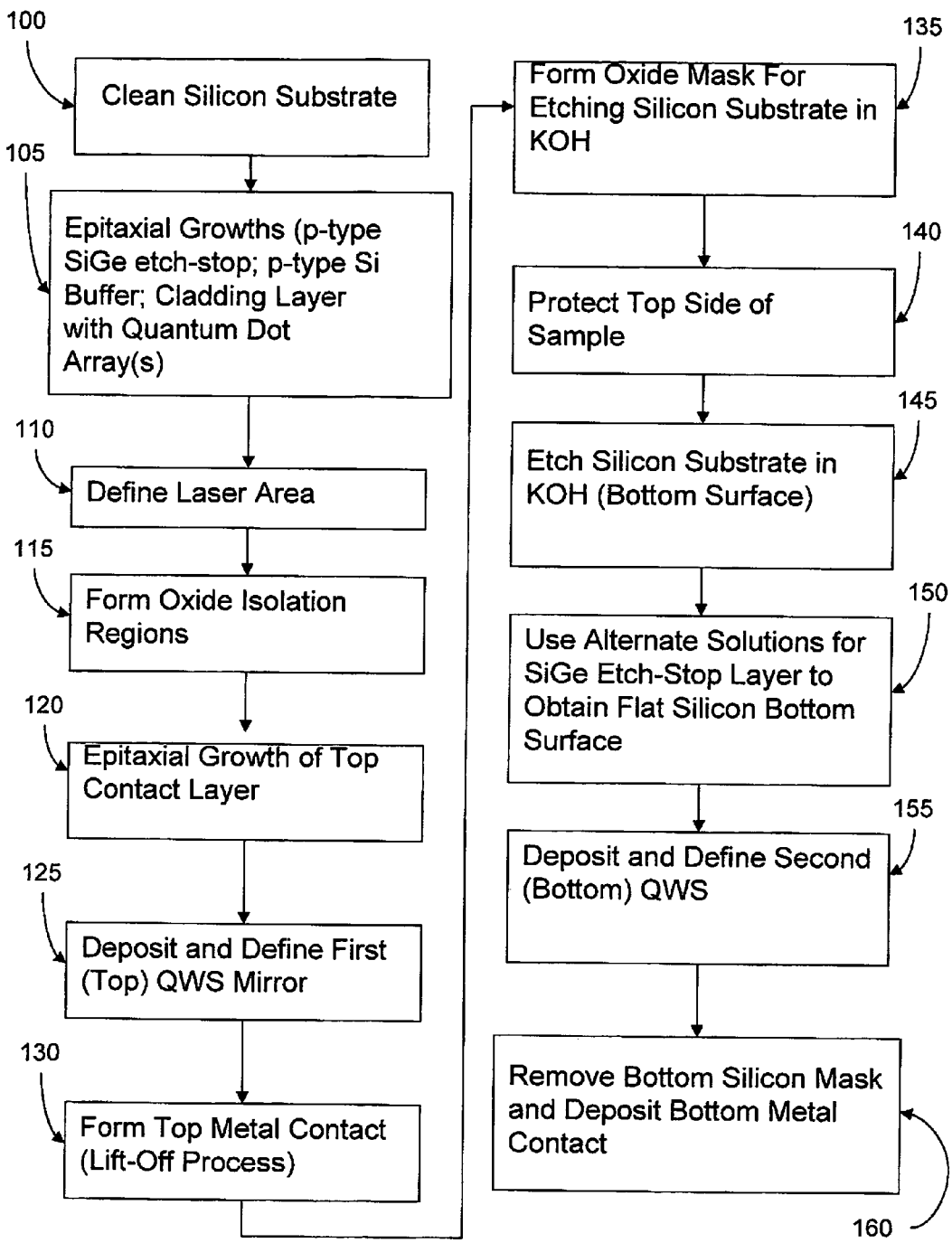
FIG. 2 illustrates a process flow chart of a method of fabricating a Si-based surface emitting laser.

FIG. 2 illustrates a process flow chart for creating a surface emitting laser 30 of the type illustrated in FIG. 1B. Step 100 involves the cleaning and/or washing of p-type silicon substrate 32. For example, this may include the wet chemical cleaning of the surface of a heavily doped p-type silicon substrate 32. In step 105, a p-type SiGe etch-stop layer (not shown), the silicon buffer layer 40, and optically active region 42 are epitaxially grown. The silicon buffer layer 40 is grown on top of the p-type SiGe etch-stop layer using a heavily doped p-type silicon buffer layer 40 having a thickness of around 3000 angstroms. With respect to the active region 42, an undoped SiGe (with 5% Ge) cladding layer 44 is formed having a plurality of InGaAs quantum dot arrays 46 (e.g., three). As seen in FIG. 1B, the cladding layer 44 may include a SiGe spacing layer 50 for a total thickness of 1000 angstroms. The active region 42 may be topped off with an undoped silicon cap layer having a thickness of about 200 angstroms.

In step 110, the laser area of the optically active region 42 is formed or otherwise defined using photolithography. In step 115, oxide isolation regions 56 are formed in the silicon buffer layer 40. For example, porous silicon may be formed using conventional techniques such as, for example, electrochemical etching of the silicon buffer layer 40. The formation of porous silicon preferably stops inside the silicon buffer layer 40. The silicon substrate 32 and structures formed thereon then undergoes thermal oxidation to form the oxide isolation regions 56. The resulting oxide isolation regions may have a thickness around 100 angstroms.

In step 120 a top contact layer 52 is formed by the non-selective epitaxial growth of heavily-doped n-type silicon to a thickness of less than 1000 angstroms. In step 125, the first quarter wave stack 36 is deposited, for example, by sputtering or evaporation. The top mirror of the first quarter wave 36 is then defined using conventional photolithography techniques and the first quarter wave stack 36 is subject to an etching process that forms the QWS 36 and stops in the n-type silicon top contact layer 52.

In step 130, the top metal contact layer 58 is then formed, for example, by evaporating or sputtering metal over a patterned resist and then subsequent partial removal by a wet-solvent lift-off process. Next, in step 135, a layer of silicon oxide is formed on the bottom side of the silicon substrate 32. The layer of silicon oxide forms an oxide mask for subsequent etching of the silicon substrate 32.

In step 140, the top side of the silicon substrate 32 (and associated constituents) is protected using, for instance, wax or deposited silicon dioxide. In step 145, the underside of the silicon substrate 32 is then etched in, for example, KOH solution. Preferably, the etching is stopped a few micrometers from the SiGe etch-stop layer grown in step 105.

In step 150, the SiGe etch-stop layer is etched to expose the silicon layer on top. For example, alternating solutions selective to Si and Ge may be employed to remove the etch-stop layer. In step 155, the second quarter wave stack 54 is formed by sputtering or evaporation on the underside of the silicon substrate 32. The second quarter wave stack 54 is defined by photolithography followed by reactive ion etching (RIE). In step 160 the bottom silicon oxide mask formed in step 135 is removed and a bottom metal contact layer 38 is formed. The bottom metal contact layer 38 may be formed by first sputtering or evaporating metal over a patterned resist and subsequent removal by a wet-solvent lift-off process.

While FIG. 1B and the process illustrated in FIG. 2 is shown in the context of a surface emitting laser 30 it should be understood that the same or similar structure may be used for photodetectors (PDs). In one aspect of the invention, the spectral response of the light emitters and/or PDs may be adjusted by controlling the size the quantum dots (20, 48).

The methods and devices described herein may be useful for creating optically active regions in a variety of devices. For example, optically active regions may be placed into LDs or LEDs integrated with silicon-based driver circuitry and photodetectors to form integrated transceivers for high bandwidth fiber optical communications.

While embodiments of the present invention have been shown and described, various modifications may be made without departing from the scope of the present invention. The invention, therefore, should not be limited, except to the following claims, and their equivalents.

What is claimed is:

1. A method of forming an optically active device comprising:
    providing a silicon substrate having a first surface and a second surface;
    epitaxially growing a silicon buffer layer on the silicon substrate on a first surface;
    epitaxially growing a SiGe cladding layer having a plurality of arrays of quantum dots disposed therein, the quantum dots being formed from a polar compound semiconductor material having a lattice mismatch with the silicon buffer layer;
    defining an optically active region in the cladding layer having the plurality of arrays of quantum dots disposed therein;
    forming oxide isolation regions adjacent to the optically active region;
    forming a first quarter wave stack above the optically active region;
    forming a first metal contact configured for electrical contact with the optically active region;
    forming a recess in the second surface of the silicon substrate;
    forming a second quarter wave stack in the recess below the optically active region; and
    forming a second metal contact on a second surface of the silicon substrate.

2. The method of claim 1, wherein the polar compound semiconductor material is selected from the group consisting of InGaAs, InGaP, InGaSb, CdTe, CdSe, and PbTe.

3. The method of claim 1, wherein the cladding layer comprises Si.

4. The method of claim 1, wherein the cladding layer comprises SiGe.

5. The method of claim 1, wherein at least one spacing layer separates adjacent arrays of quantum dots.

6. A method of forming an optoelectronic device comprising:
    providing a silicon substrate having a first surface and a second surface and a silicon buffer layer disposed on a first surface;
    epitaxially depositing an optically active region over the buffer layer, the optically active region comprising upper and lower SiGe cladding layers and a plurality of stacked quantum dot arrays disposed there between, wherein the quantum dots are formed from a compound semiconductor material selected from the group consisting of InGaAs, InGaP, InGaSb, CdTe, CdSe, and PbTe;
    forming isolation regions adjacent to the optically active region;
    forming a silicon capping layer over the optically active region;
    forming a first quarter wave stack above the optically active region;
    forming a first metal contact on the silicon capping layer;
    forming a recess in the second surface of the silicon substrate;
    forming a second quarter wave stack in the recess below the optically active region; and
    forming a second metal contact on a second surface of the silicon substrate.

7. The method of claim 6, wherein the buffer layer comprises doped p-type silicon.

8. The method of claim 6, wherein the optically active region is epitaxially grown.

9. The method of claim 6, wherein the cladding layer comprises undoped SiGe having about 5% Ge.

10. The method of claim 6, wherein the optically active region comprises one or more SiGe spacing layers disposed between adjacent quantum dot arrays.

11. The method of claim 6, wherein the silicon capping layer has a thickness of less than 1000 angstroms.

* * * * *